United States Patent
Döllgast et al.

(10) Patent No.: US 7,612,487 B2
(45) Date of Patent: Nov. 3, 2009

(54) CONTACT MAT FOR AN ACTUATOR, AND ASSOCIATED PRODUCTION METHOD

(75) Inventors: Bernhard Döllgast, Erlangen (DE); Horst Gilg, Maxhütte (DE); Jörg Haubold, Limbach-Oberfrohna (DE); Carsten Schuh, Baldham (DE); Claus Zumstrull, Regenstauf (DE)

(73) Assignee: Siemens Aktiengesellschaft, Munich (DE)

(*) Notice: Subject to any disclaimer, the term of this patent is extended or adjusted under 35 U.S.C. 154(b) by 4 days.

(21) Appl. No.: 10/595,756

(22) PCT Filed: Nov. 10, 2004

(86) PCT No.: PCT/EP2004/052910
§ 371 (c)(1),
(2), (4) Date: Feb. 27, 2007

(87) PCT Pub. No.: WO2005/047689
PCT Pub. Date: May 26, 2005

(65) Prior Publication Data
US 2007/0032132 A1  Feb. 8, 2007

(30) Foreign Application Priority Data
Nov. 12, 2003  (DE)  ................ 103 52 772

(51) Int. Cl.
*H01L 41/08* (2006.01)
(52) U.S. Cl. ........................ 310/328
(58) Field of Classification Search ......... 310/328, 310/366
See application file for complete search history.

(56) References Cited

U.S. PATENT DOCUMENTS

| 4,219,755 | A | * | 8/1980 | O'Neill et al. | 310/348 |
| 6,307,306 | B1 | | 10/2001 | Bast et al. | 310/366 |
| 6,316,863 | B1 | | 11/2001 | Schuh et al. | 310/328 |

FOREIGN PATENT DOCUMENTS

| DE | 19930585 | | 2/2000 |
| DE | 19945933 | | 5/2001 |
| DE | 10026635 | | 1/2002 |
| DE | 10026635 | A1 | 1/2002 |
| DE | 10112588 | | 5/2002 |

OTHER PUBLICATIONS

International Search Report and Written Opinion; PCT/EP2004/052910; 13 Pgs, Feb. 2005.
Office Action for Chinese Application No. 200480033298.0 (6 pages), Oct. 26, 2007.
Office Action for German Application No. 10352772.9-35 (4 pages), Oct. 28, 2007.
Search Report for International Application No. PCT/EP2004/052910 (11 pages), Feb. 25, 2005.

* cited by examiner

*Primary Examiner*—Mark Budd
(74) *Attorney, Agent, or Firm*—King & Spalding L.L.P.

(57) ABSTRACT

A contact mat (9) for electrically contacting an actuator, particularly a piezo actuator for an injector of an injection system has several electrically conductive wires (5) that are placed next to each other and several mechanical transversal connections located between the individual wires (5). The transversal connections consist of one respective terminal post (3, 4, 20-22) of the actuator.

12 Claims, 4 Drawing Sheets

CONTACT MAT FOR AN ACTUATOR, AND ASSOCIATED PRODUCTION METHOD

CROSS-REFERENCE TO RELATED APPLICATIONS

This application is a U.S. national stage application of International Application No. PCT/EP2004/052910 filed Nov. 10, 2004, which designates the United States of America, and claims priority to German application number DE 103 52 772.9 filed Nov. 12, 2003, the contents of which are hereby incorporated by reference in their entirety.

TECHNICAL FIELD

The invention relates to a contact mat for electrical contacting of an actuator, especially for a piezo actuator for driving an injector of an injection system, as well as to an associated production method.

BACKGROUND

Modern injection systems for internal combustion engines increasingly feature piezo actuators for mechanical activation of the injectors, which exhibit better dynamic behavior when compared with conventional electromagnetic actuators. These types of piezo actuator conventionally have a piezo stack, in which a plurality of layered piezo elements are arranged one above the other, with layered electrodes being located between the individual piezo elements in each case. The electrical contacting of the piezo stack is undertaken by metallization strips which are arranged on opposite side surfaces of the piezo stack and extend over the entire length of the piezo stack, with the individual layered electrodes of the piezo stack being alternately connected to one of the two metallization strips. The two metallization strips are connected in their turn with two terminal posts which are arranged on opposite sides of the piezo stack and protrude from the end face of the piezo actuator to allow electrical contacting on the outside.

The use of a contact mat in the form of a wire mesh is known from DE 100 26 635 A1 for electrical connection of the metallization strips of the piezo stack with the associated terminal posts, with the contact mat featuring what is known as weft and warp threads. The weft threads are arranged in parallel to each other in this case, consist of a conductive material and connect the metallization strips of the piezo stack with the associated terminal post in each case. The warp threads on the other hand run at right angles within the contact mat to the weft and connect these to each other in order to mechanically stabilize the warp.

The disadvantage of this known contact mat is the fact that the operation of the piezo actuator can result in breaks and tears in the contact mat.

SUMMARY

The underlying object of the invention is therefore to improve the contact mat described above to the extent that no faults occur during the operation of the actuator.

In addition the contact mat should make it possible to electrically contact the piezo actuator even with low cost series production of a piezo actuator.

This object can be achieved by a contact mat for electrical contacting of an actuator comprising a number of electrically-conductive wires arranged next to one another, and a number of mechanical transversal connections between the individual wires, wherein the transversal connections consist in each case of one terminal post of the actuator.

The terminal posts may comprise wire guides to mechanically guide the wires. The wire guides may consist of a flattening of the terminal posts. The wire guides may consist of nicks in the terminal posts, with the nicks running in the longitudinal direction of the wires. The terminal posts can be essentially arranged equidistantly in the longitudinal direction of the wires. The terminal posts can be arranged in the longitudinal direction of the wires at a distance which is greater than the length of the wires for a complete contacted actuator. The terminal posts can be connected to the wires by a solder connection. The individual wires between the terminal posts can be connected to each other by a flexible material. The flexible material can be elastic and/or vibration-damping. The individual wires can be encapsulated in the flexible material. The individual wires can be molded within or extrusion coated with the flexible material. In an actuator, such a contact mat can be used for electrical connection of a piezo stack with two terminal posts. An injector for an injection system may comprise such an actuator.

The object can also be achieved by a production method for a contact mat for electrical contacting of an actuator, comprising the following steps of: Arrangement of a number of electrically-conductive wires next to each other, Mechanical connection of individual wires to each other by a number of transversal connections, wherein the transversal connections consist in each case of one terminal post of the actuator.

The terminal posts can be connected to the wires by a solder connection. The wires can be unwound from one or more feed rolls, to arrange the wires next to one another. The production method may further comprise the following steps: Attaching the wires of a first contact mat to a first contact strip of an actuator, Separating the wires of the first contact mat between the two terminal posts which are closest to the actuator, Attaching the wires of a second contact mat to a second contact strip of the same actuator, and Separating the wires of the second contact mat between the two terminal posts which are closest to the actuator. The wires of the contact mat between the terminal posts can be connected to one another by a flexible material. The flexible material can be elastic and/or vibration-damping. The individual wires can be encapsulated with the flexible material. The individual wires can be molded within or injection coated with the flexible material. The individual wires can be interconnected by the wires being immersed in the flexible material with the flexible material coating the wires and forming connection bridges between the wires. The wires can be immersed in the liquid flexible material before the wires are connected to the actuator body and the associated terminal posts. The wires together with the actuator body and the terminal posts can be immersed in the liquid material after the wires have been connected to the actuator body and the associated terminal posts. The actuator body with the associated terminal posts and the contact mat may be encapsulated with an encapsulant.

The invention is based on the technical knowledge that tears occurring during operation of the actuator within the contact mat are caused by the change in length of the piezo stack, which imposes a mechanical load on the warp threads.

There is therefore provision within the context of the invention not to establish the transversal connections between the wires of the contact mat by separate warp threads but by the terminal posts of the actuator. This is advantageous since the terminal posts of the actuator within the contact mat are furthest away from the actuator in the assembled state and therefore are the least influenced by operation-related changes in the length of the actuator.

The inventive contact mat therefore features, in a conventional manner, a number of electrically-conductive wires arranged next to each other which are connected to each other by transversal connections in order to form a contact mat. The transversal connections between the individual wires however consist in this case, unlike in the prior art, of the terminal posts which in the assembled state are used for electrical contacting of the actuator.

Preferably the terminal posts of the inventive contact mat feature wire guides to guide the individual wires mechanically. These types of wire guides can for example consist of flattenings or nicks of the terminal posts, but other embodiments of the wire guides are also possible.

In a preferred exemplary embodiment of the invention the terminal posts are essentially arranged equidistantly within the contact mat in the longitudinal direction of the wires. This is advantageous since with finished actuators of the same type the wire length between the metallization strips of the actuator and the associated terminal post is constant.

In addition the invention comprises the general technical teaching of using a flexible material (e.g. Silicon) rather than inflexible warp threads made of wire in order to connect the individual wires of the contact mat between the terminal posts with one another. The flexibility of the connection between the individual wires of the contact mat advantageously prevents a change in length of the piezo stack leading to damage to the connection in subsequent operation.

The flexible material is preferably elastic and/or vibration-damping in order to avoid damage in subsequent operation. It is however theoretically also possible for the flexible material to exhibit a plastic deformation behavior. The only decisive factor is that the material is sufficiently flexible to compensate during subsequent operation of the actuator for the change in length of the actuator body.

In a preferred exemplary embodiment of the invention the individual wires of the contact mat are encapsulated in the flexible material, to which end the individual wires can for example be molded within the flexible material or have the material injection coated onto them.

Silicon is especially advantageously suited to use as the material for flexible connection of the individual wires of the contact mat or another material containing Silicon, since Silicon exhibits could elastic properties and a good damping behavior. The invention is however not restricted to Silicon as regards the material to be used for flexible connection of the wires, but can basically also be implemented with other materials which exhibit a suitable deformation behavior.

The advantage of connecting the individual wires into a contact mat is the ease of handling since the contact mat for example can be wound onto a feed roll in which case the wound contacting mat makes it possible to provide contacting for a plurality of actuators. The contacting mat can also be prefabricated in a separate production process which allows efficient and cost-effective production.

The invention however it does not relate only to the contacting mat described here but also to an actuator with a contact mat of this type for electrical connection of an actuator body with two associated terminal posts.

The advantage of an actuator of this type with the inventive contact mat includes the fact that a complete encapsulation of the actuator with an encapsulant (e.g. Silicon) can be dispensed with since the individual wires of the contact mat are already supported sufficiently by the flexible material.

It is however also basically possible, with the inventive actuator, to encapsulate the actuator in a conventional manner solidly and completely with an encapsulant (e.g. Silicon). With this type of solid encapsulation of the actuator the encapsulant however preferably differs in respect of its material properties from the flexible material which connects the individual wires of the contact mat to each other. Thus the flexible material for connecting individual wires of the contact mat should preferably exhibit a wetting and flow behavior which makes it possible to apply the flexible material to the wires of the contact mat using an immersion process, with the flexible material forming connection bridges between the individual wires of the contact mat when set. By contrast the encapsulant for the solid encapsulation of the entire actuator should preferably exhibit a wetting and flow behavior which also ensures that small cavities within the actuator are filled.

The inventive contact mat can thus be manufactured as part of a separate manufacturing process so that the finished contact mat can be connected to the actuator body.

BRIEF DESCRIPTION OF THE DRAWINGS

Other advantageous developments of the invention are explained in more detail below together with the description of the preferred exemplary embodiment of the invention with reference to the Figures. The Figures show.

DETAILED DESCRIPTION

Figure 1:
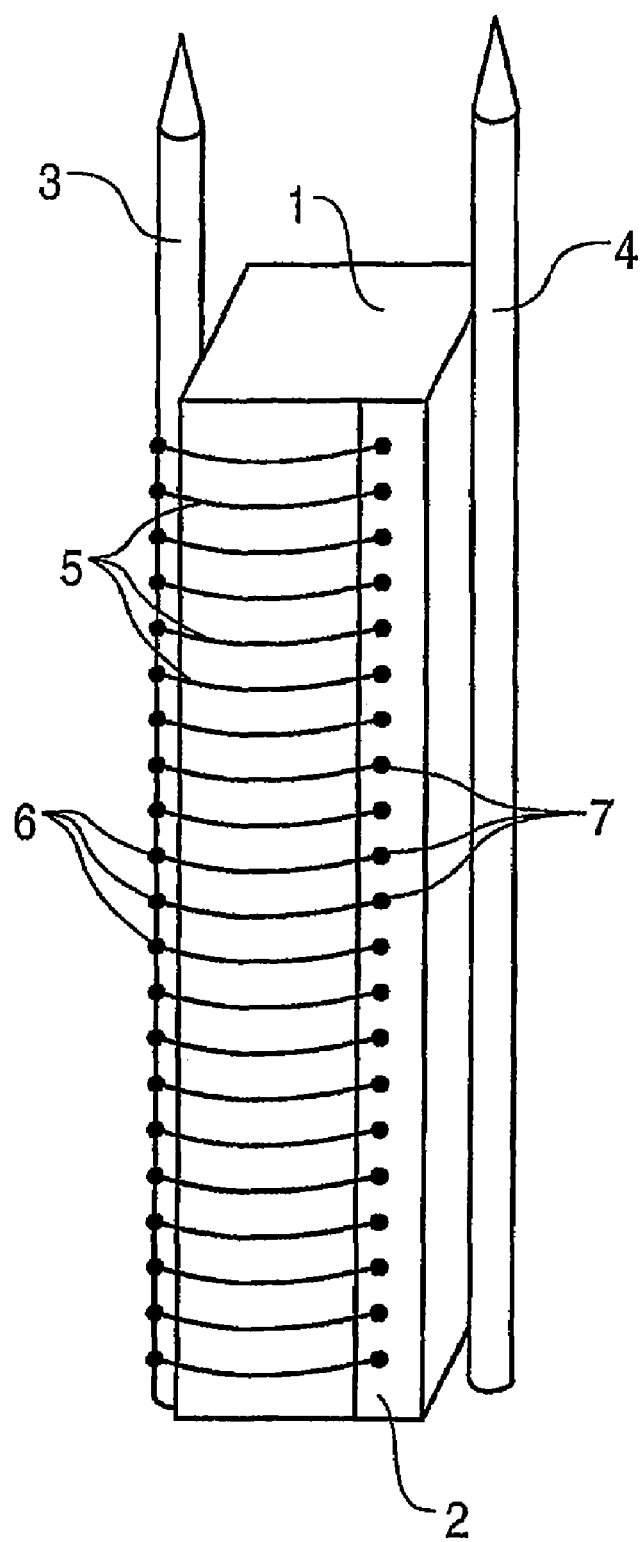
FIG. 1 a perspective view of a piezo stack with two associated terminal posts and a contact mat for electrical connection of the piezo stack with the terminal posts, FIG. 2 a cross-sectional view of a part of the contact mat from FIG. 1, FIG. 3 a schematic diagram of a device for carrying out the inventive production method, FIG. 4 a schematic cross-sectional view of the piezo stack with the terminal posts and the contact mat from FIG. 3, FIG. 5 the inventive contact mat from FIGS. 1 and 2 in the pre-assembled state as well as FIG. 6 a terminal post of the inventive contact mat in cross section with one of the wires.

The cross-sectional view in FIG. 1 shows a piezo stack 1 which features a plurality of layered piezo elements arranged above one another, with an electrode layer arranged between the individual piezo elements in each case.

A metallization strip 2 running over the entire length of the piezo stack is applied to the front side surface of the piezo stack 1 visible in the drawing.

A further metallization strip of this type is applied to the rear side surface of the piezo stack 1 not visible in the drawing; with the individual electrode layers of the piezo stack 1 being connected alternately with the metallization strip 2 and with the unseen rear metallization strip.

Electrical contact is made in this case by two terminal posts 3, 4 which are arranged at the sides next to the piezo stack 1 and are aligned in parallel to one another.

Terminal post 3 is connected via a plurality of electrically conductive wires 5 to metallization strip 2, whereas terminal post 4 is connected via unseen further wires to the metallization strip which is arranged on the rear of the piezo stack 1 and is not visible in the drawing.

The individual wires 5 are connected in this case by solder points 6, 7 to the terminal post 3 and the metallization strip 2.

The advantage of connecting the metallization strip 2 to the terminal post 3 by a plurality of wires 5 lies in the fact that the individual wires 5 can individually follow the movement of the piezo stack 1 with the change in length of the piezo stack which occurs during subsequent operation of the piezo actuator, which reduces the danger of damage to the wires 5.

In addition the fact that there is a plurality of wires results in greater operational security, since even if an electrical connection made by one of the wires is interrupted secure contact is still guaranteed by the other wires 5.

Figure 2:
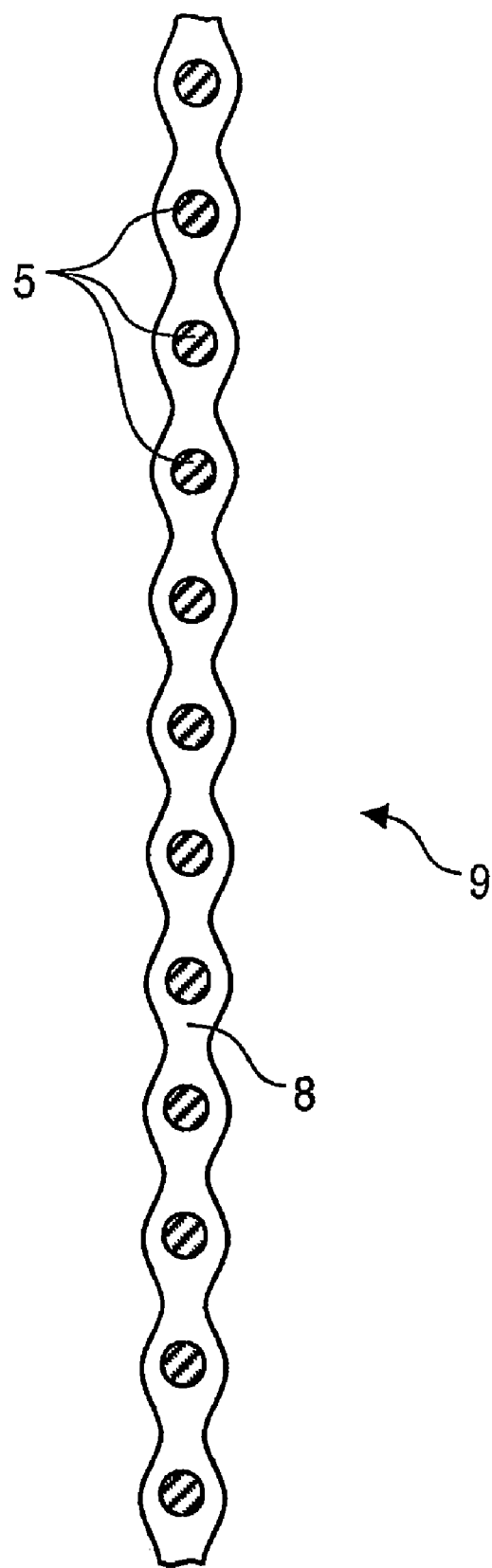

To make the drawing clearer the wires are shown as individual wires in FIG. 1. It is evident however from the cross-sectional view shown in FIG. 2 that the individual wires 5 are embedded in a material 8 and form a contact mat 9 with the material 8 forming mechanical connection bridges between the individual wires 5.

The material 8 is Silicon in this case which behaves in an elastic and vibration-damping manner; so that changes in length of the piezo stack 1 during subsequent operation of the piezo actuator do not lead to damage to the wires 5 or the solder points 6, 7.

The encapsulation of the wires 5 with the flexible material 8 can in this case be undertaken as part of a separate production process before the contact mat 9 is connected to the piezo stack and the terminal posts 3, 4. To this end individual wires 5 can be dipped into an immersion bath of liquid Silicon for example, with the surfaces of the wires 5 being wetted with Silicon, so that connecting bridges are formed between the individual wires 5.

Figure 3:
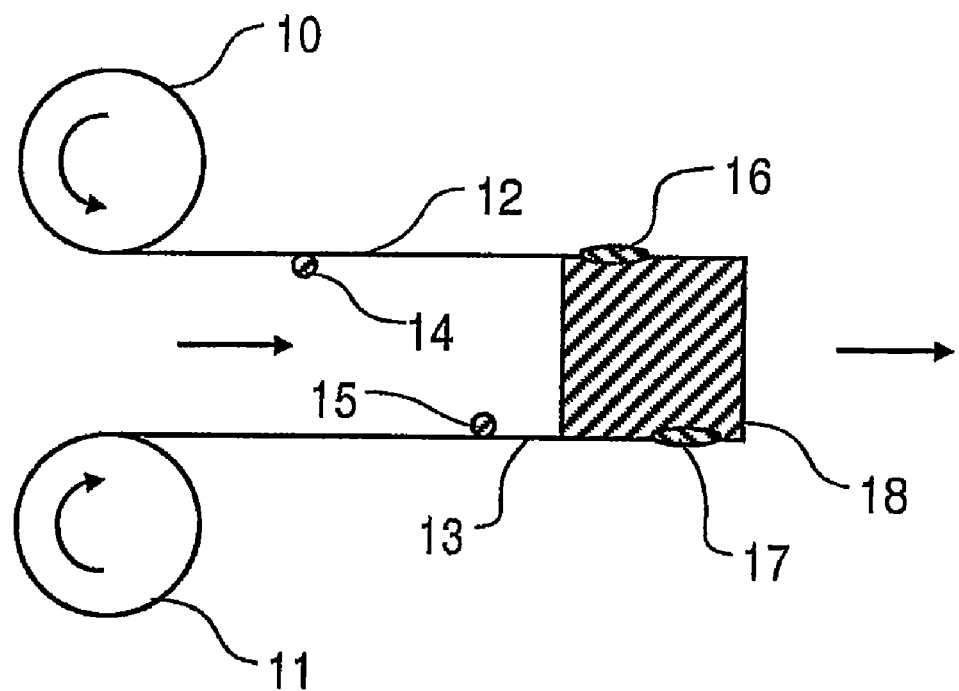

FIG. 3 shows in greatly simplified form a device for producing piezo actuators with the inventive contact mat.

The device features two feed rolls 10, 11 for this purpose, onto which a finished contact mat 12, 13 is wound in each case.

The contact mats 12, 13 with the terminal posts 14, 15 are then unwound from the feed rolls 10, 11 and applied to the metallization strips 16, 17 of a piezo stack 18.

Subsequently the contact mat 12 is then soldered to the metallization strip 16 and then separated between the terminal post 14 and feed roll 10.

In a similar manner the contact mat 13 is soldered to the metallization strip 17 and then separated between the terminal post 15 and the feed roll 11.

Figure 4:
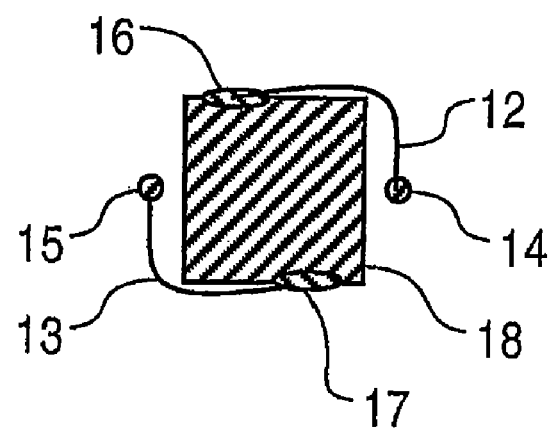

In a next working step the contact mat 12 is then wound around the piezo stack 18 in a clockwise direction until the terminal post 14 assumes the end position shown in FIG. 4.

In a similar way the contact mat 13 is also wound around the contact mat 18 in a clockwise direction until the terminal post 15 assumes the end position shown in FIG. 4.

Finally the complete piezo unit can also be solidly encapsulated, a process which is known and therefore not described in any greater detail here, in order to simplify the description.

Figure 5:
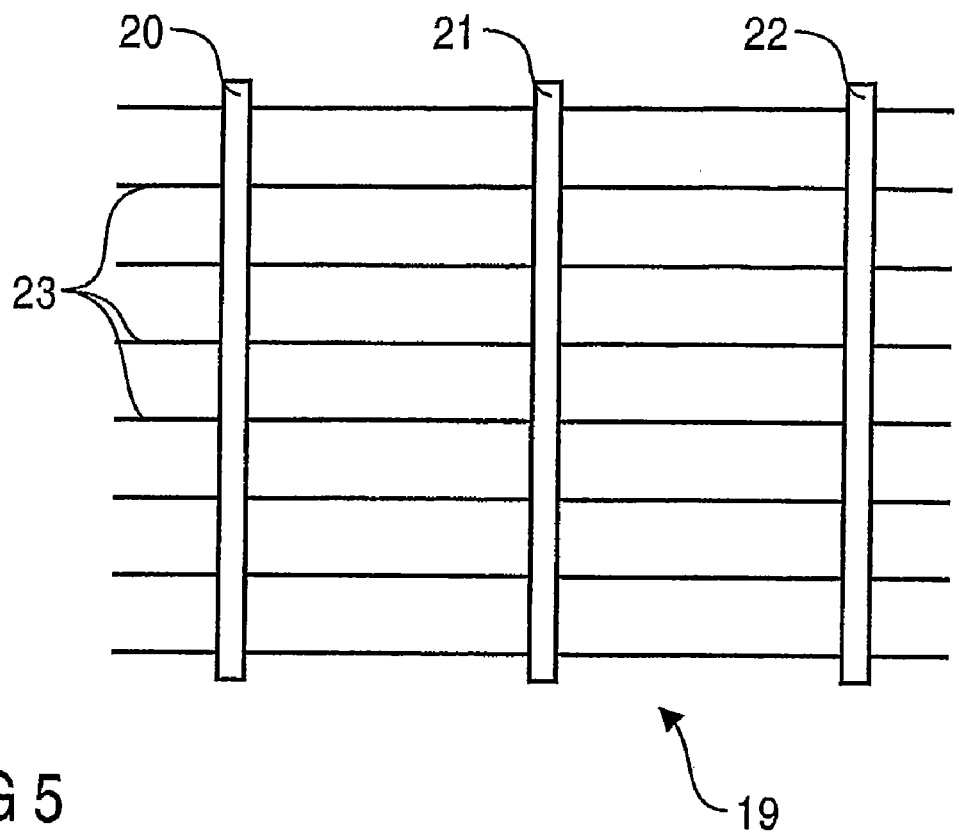

FIG. 5 further shows the contacting mat 19 in the pre-assembled state with three terminal posts 20, 21, 22 and a number of wires 23, with the terminal posts 20-22 being soldered to the wires 23 and running transverse to the wires 23. The contact mat 19 can thus be prefabricated, with it being possible to store the contact mat 19 on a feed roll, as has been described above.

Figure 6:
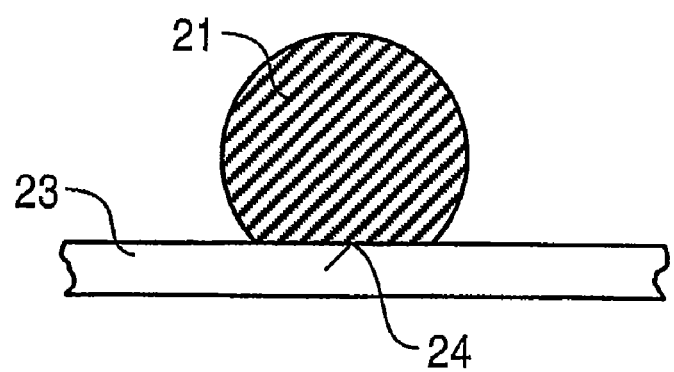

FIG. 6 finally shows a cross-section through the terminal post 21 of the contact mat 19. It is evident from this diagram that the terminal post 21 has a flat section 24 in the area of the wire 23 which facilitates the soldering of the wire 23 to the terminal post 21.

The invention is not restricted to the exemplary embodiments described here. Instead a plurality of variants and derivatives are possible which also make use of the inventive idea and therefore fall into the protected area.

What is claimed is:

1. A contact mat for electrical contacting of an actuator comprising:
   a plurality of electrically-conductive wires arranged next to one another;
   a flexible material connecting the plurality of electrically-conductive wires to each other; and
   a plurality of mechanical connections between the individual wires and at least one terminal post of the actuator running transverse to the wires.

2. A contact mat in accordance with claim 1, wherein the terminal posts comprise wire guides to mechanically guide the wires.

3. A contact mat in accordance with claim 2, wherein the wire guides consist of a flattening of the terminal posts.

4. A contact mat in accordance with claim 2, wherein the wire guides consist of nicks in the terminal posts, with the nicks running in the longitudinal direction of the wires.

5. A contact mat in accordance with claim 1, wherein the terminal posts are essentially arranged equidistantly in the longitudinal direction of the wires.

6. A contact mat in accordance with claim 1, wherein the terminal posts are arranged in the longitudinal direction of the wires at a distance which is greater than the length of the wires for a complete contacted actuator.

7. A contact mat in accordance with claim 1, wherein the terminal posts are connected to the wires by a solder connection.

8. A contact mat in accordance with claim 1, wherein the flexible material is elastic and/or vibration-damping.

9. A contact mat in accordance with claim 1, wherein the individual wires are encapsulated in the flexible material.

10. A contact mat in accordance with claim 1, wherein the individual wires are molded within or extrusion coated with the flexible material.

11. An actuator with a contact mat in accordance with claim 1, for electrical connection of a piezo stack with two terminal posts.

12. An injector for an injection system with an actuator in accordance with claim 11.

* * * * *